United States Patent [19]
Costa et al.

[11] Patent Number: 5,578,860
[45] Date of Patent: Nov. 26, 1996

[54] MONOLITHIC HIGH FREQUENCY INTEGRATED CIRCUIT STRUCTURE HAVING A GROUNDED SOURCE CONFIGURATION

[75] Inventors: Julio C. Costa; Wayne R. Burger, both of Phoenix; Natalino Camilleri; Christopher P. Dragon, both of Tempe; Daniel J. Lamey, Phoenix; David K. Lovelace, Chandler; David Q. Ngo, Phoenix, all of Ariz.

[73] Assignee: Motorola, Inc., Schaumburg, Ill.

[21] Appl. No.: 431,948

[22] Filed: May 1, 1995

[51] Int. Cl.$^6$ .......................... H01L 23/62; H01L 29/76; H01L 29/00
[52] U.S. Cl. .......................... 257/528; 257/362; 257/368; 257/529
[58] Field of Search ................... 257/362, 363, 257/528, 529, 3

[56] References Cited

U.S. PATENT DOCUMENTS

| | | |
|---|---|---|
| 4,930,036 | 5/1990 | Sitch . |
| 4,969,032 | 11/1990 | Scheitlin et al. . |
| 5,021,859 | 6/1991 | Ito et al. . |
| 5,041,889 | 8/1991 | Kriedt et al. .......................... 257/362 |
| 5,119,162 | 6/1992 | Todd et al. . |
| 5,155,563 | 10/1992 | Davies et al. . |
| 5,166,639 | 11/1992 | Green et al. . |
| 5,242,841 | 9/1993 | Smayling et al. . |
| 5,317,180 | 5/1994 | Hutter et al. . |
| 5,359,211 | 10/1994 | Croft .......................... 257/173 |

OTHER PUBLICATIONS

IBM Technical Disclosure Bulletin, Programmable Substrate Inductor, vol. 32, No. 6B, Nov. 1989, pp. 310–316.

*Primary Examiner*—Mahshid Saadat
*Assistant Examiner*—Valencia Martin Wallace
*Attorney, Agent, or Firm*—Kevin B. Jackson

[57] ABSTRACT

A high frequency power FET device (22) is integrated with passive components (23,24,26,28,31), an electro-static discharge (ESD) device (27,127,227), and/or a logic structure (29) on a semiconductor body (13) to form a monolithic high frequency integrated circuit structure (10). The high frequency power FET device (22) includes a grounded source configuration. The logic structure (29) utilizes the high frequency power FET structure in a grounded source configuration as one device in a CMOS implementation.

32 Claims, 9 Drawing Sheets

MONOLITHIC HIGH FREQUENCY INTEGRATED CIRCUIT STRUCTURE HAVING A GROUNDED SOURCE CONFIGURATION

BACKGROUND OF THE INVENTION

This invention relates, in general, to high frequency semiconductor integrated circuits, and more particularly, to methods and structures for integrating passive components, logic devices, and electro-static discharge (ESD) devices into a high frequency power transistor process flow.

High frequency power amplifiers are well known and used, for example, in personal communication applications such as cellular telephones and pagers. As the personal communications industry is pushed towards smaller and lighter products, the components that make up these products must also become smaller and lighter. Typical silicon-based high frequency power amplifier circuits for personal communication products are manufactured using discrete components in hybrid integrated circuit configurations. That is, discrete power transistors, resistors, inductors, capacitors, logic devices, and ESD films or devices are formed or placed onto a hybrid circuit board to provide a power amplifier circuit. These hybrid configurations are very expensive and are large in size, with sizes of 2.0 centimeters by 3.0 centimeters being typical.

Silicon-based high frequency devices such as the laterally diffused metal-oxide semiconductor (LDMOS) power transistor are attractive because they provide good performance at frequencies in a range from 100 MHz to about 2 GHz. Also, LDMOS power transistors are more cost effective than III–V based high frequency devices in this frequency range. An example of a high frequency LDMOS power transistor design is provided in U.S. Pat. No. 5,155,563 issued to Robert B. Davies et al. and assigned to Motorola Inc.

High frequency monolithic integrated III–V power amplifier circuits are often used in personal communication applications. However, these devices require a negative power supply because they use depletion mode MESFET power devices. Also, III–V power amplifier circuits have been found to have long term reliability problems. In addition, III–V power amplifier circuits use complex air bridge inductor designs that are difficult to manufacture.

With the drive towards smaller and lighter components in support of smaller and lighter personal communication products, structures and methods are needed that provide for a cost effective and reliable monolithic integration of passive components (e.g., capacitors, inductors, transmission lines, and resistors), ESD components, and logic components into a high frequency power transistor structure.

BRIEF DESCRIPTION OF THE DRAWINGS

FIG. 5-1 illustrates an enlarged cross-sectional view of the inductor structure shown in FIG. 4 taken along reference line 5—5;

FIG. 5-2 illustrates an enlarged cross-sectional view of a portion of another inductor structure embodiment according to the present invention;

FIG. 10-1 is a circuit diagram of logic cell according to FIGS. 3 and 11–13;

FIG. 10-2 is a top view of a logic cell layout according to the present invention;

DETAILED DESCRIPTION OF THE DRAWINGS

Generally, the present invention provides means and methods for integrating passive components (e.g., inductors, series capacitors, shunt capacitors, resistors, and transmission lines), electro-static discharge (ESD) devices, and logic devices into a high frequency power transistor process flow. In particular, the methods and structures are suitable for integration into high frequency laterally diffused metal-oxide semiconductor (LDMOS) field effect transistor process flow.

The structures and methods provided herein form a monolithic high frequency (up to about 2 GHz) power amplifier integrated circuit device. One can better understand the present invention by referring to FIGS. 1–15 together with the following detailed description. For ease of understanding, the same elements retain the same numbers between drawings where appropriate.

Figure 1:
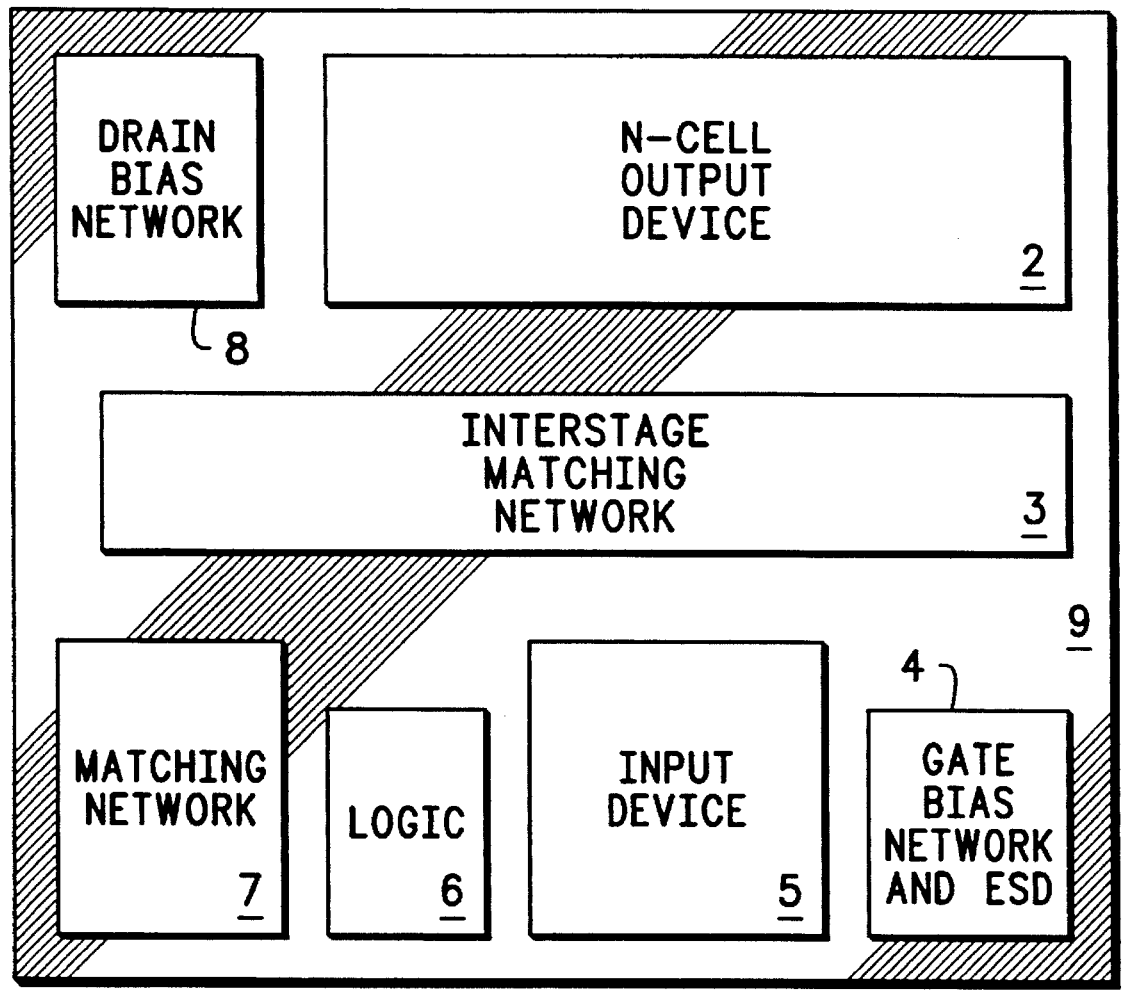
FIG. 1 illustrates a top view representation of a two-stage high frequency power amplifier circuit layout according to the present invention.

FIG. 1 illustrates an enlarged top view representation of an example of a layout of a two-stage high frequency integrated circuit structure 1 according to the present invention. Structure 1 is provided as an example to show where the various components according to the present invention are used. The exact integration depends on the requirements of the particular circuit design. The structures and methods provided herein provide the necessary building blocks for the high frequency integrated circuit designer.

Structure 1 comprises an N-cell output device 2 that includes LDMOS power transistor structures. Interstage matching network 3 includes inductor structures, series and shunt capacitor structures, and transmission line structures. Gate bias network 4 includes resistor structures, shunt capacitor structures, inductor structures, and an electro-static discharge (ESD) structure. Input device 5 includes LDMOS power transistor structures, logic portion 6 includes CMOS logic structures, and matching network 7 includes shunt capacitor structures, resistor structures, and transmission line structures. Drain bias network 8 includes inductor structures, transmission line structures, and series capacitor structures. Optionally, logic structures are incorporated into interstage matching network 3. Region 9 represents a passivation region and is used to separate the various components and for constructing some of the components.

Figure 2:
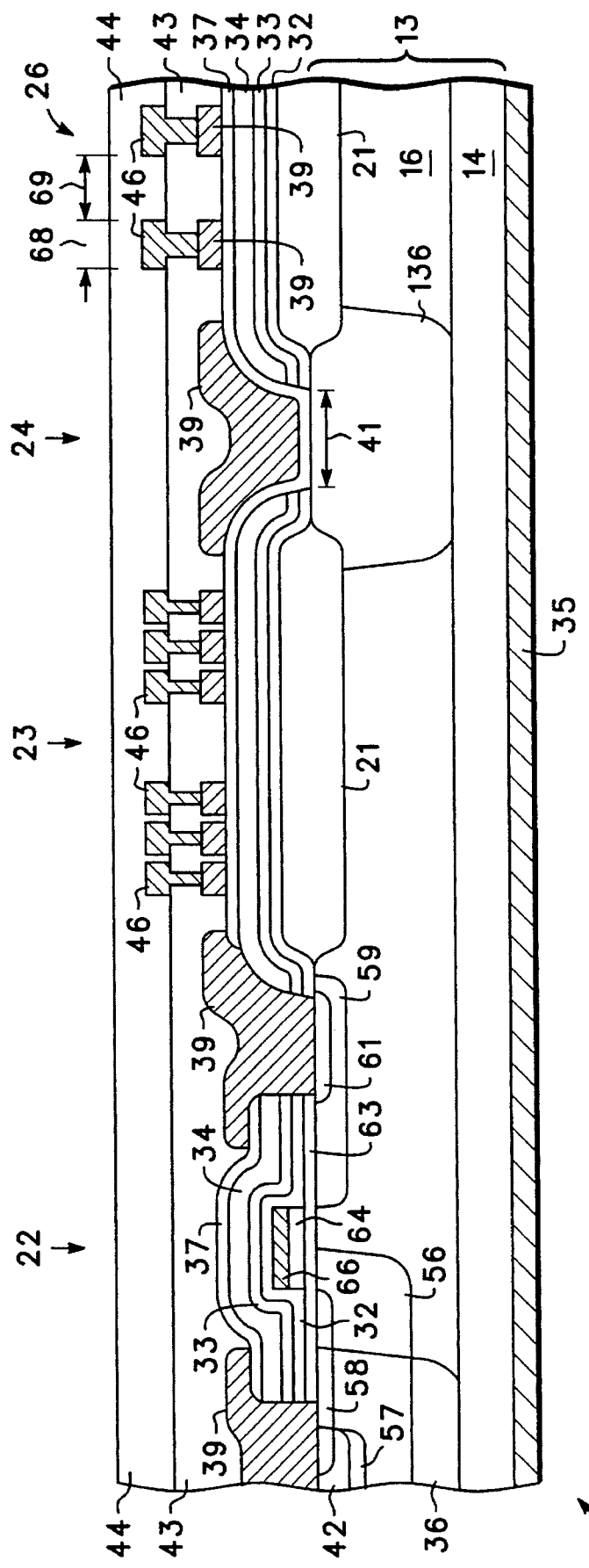
FIG. 2 illustrates an enlarged cross-sectional view of a portion of a monolithic high frequency integrated power amplifier structure according to the present invention.
Figure 3:
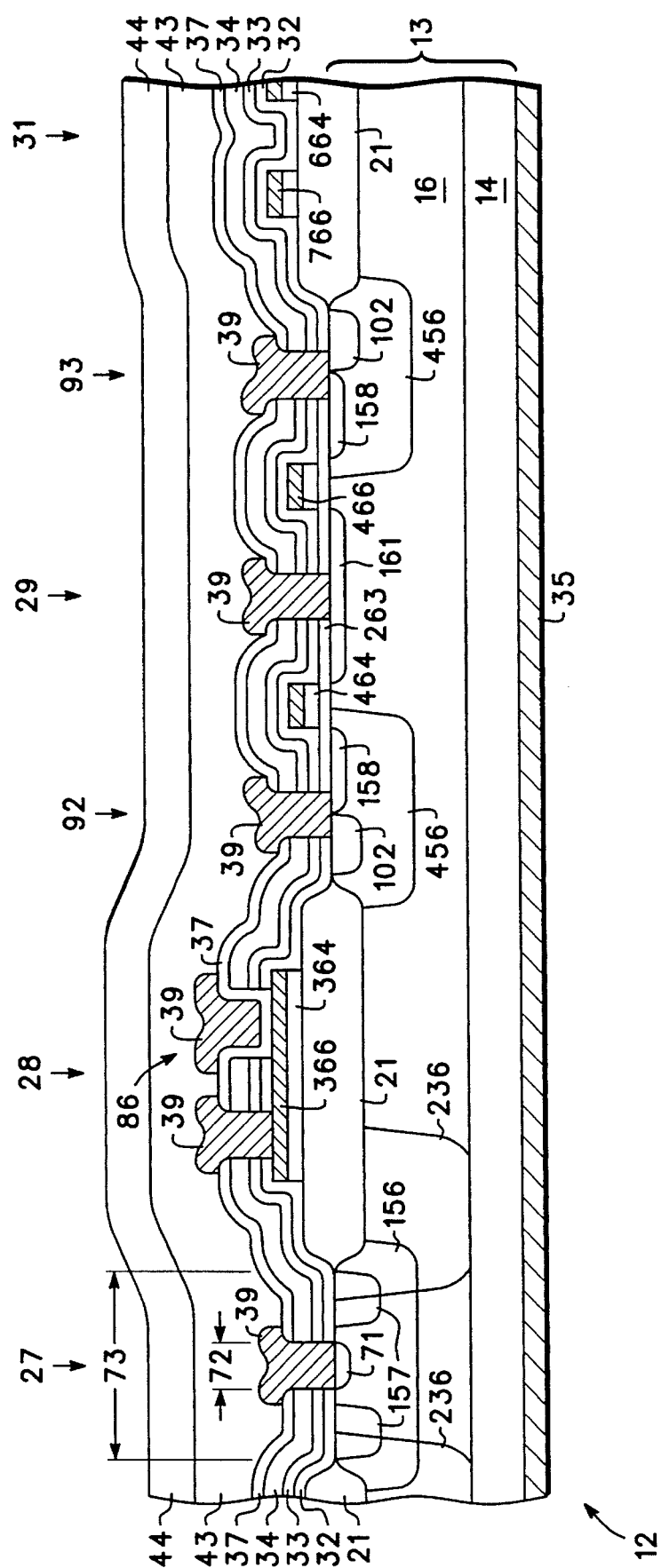
FIG. 3 illustrates an enlarged cross-sectional view of an additional portion of a monolithic high frequency integrated power amplifier structure according to the present invention.

FIG. 2 illustrates a portion 11 of an enlarged cross-sectional view of an embodiment of a monolithic high frequency (i.e., up to about 2 GHz) power amplifier integrated circuit structure or structure 10 according to the present invention. FIG. 3 illustrates a second portion 12 of structure 10. It is understood that the locations of the specific devices in FIGS. 2 and 3 are not intended to be limiting and their final location depends on the specific layout of the high frequency integrated circuit. Also, the individual structures are spaced close together in FIGS. 2 and 3 so that they may conveniently fit within the drawings. It is understood that the actual spacing between the structures may be greater.

Structure 10 includes semiconductor body or material 13. Semiconductor body 13 includes a substrate, ground plane layer, or first layer 14 and a lightly doped layer, epitaxial layer, or second layer 16 formed on ground plane layer 14. Preferably, ground plane layer 14 is a heavily doped p-type silicon substrate having a dopant concentration on an order of $5.0 \times 10^{18}$ to $1.0 \times 10^{19}$ atoms/cm$^3$. Preferably, second layer 16 comprises silicon, has the same conductivity type as ground plane layer 14, is more lightly doped than ground plane layer 14, and preferably has a dopant concentration on an order of $1.0 \times 10^{15}$ to $2.0 \times 10^{15}$ atoms/cm$^3$. Preferably, second layer 16 has a starting thickness in a range from approximately 9.0 to 11.0 microns.

Portions of second layer 16 are isolated or segregated by field passivation regions 21. Typically, field passivation regions 21 have a thickness greater than approximately 1.8 microns to provide sufficient isolation between adjacent active areas and between ground plane layer 14 and passive components subsequently formed on or above field passivation regions 21. Structure 10 optionally includes an ohmic layer 35 formed on the lower surface of semiconductor body 13. Ohmic layer 35 typically comprises a gold layer approximately 12,000 angstroms thick.

Figure 11:
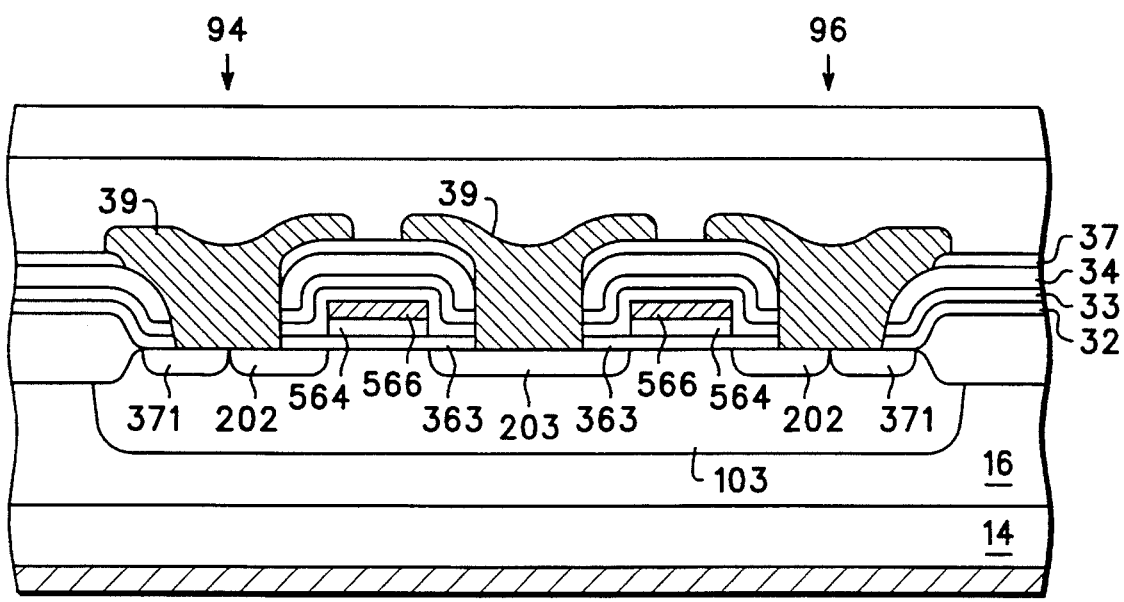
FIG. 11 illustrates another portion of the logic structure according to the present invention.
Figure 12:
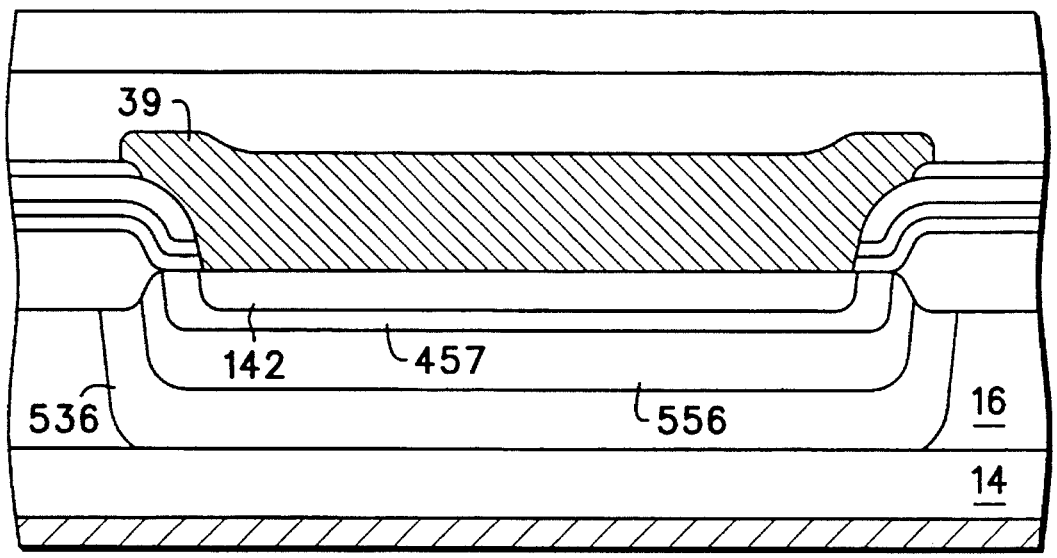
FIG. 12 illustrates a further portion of the logic structure according to the present invention.
Figure 13:
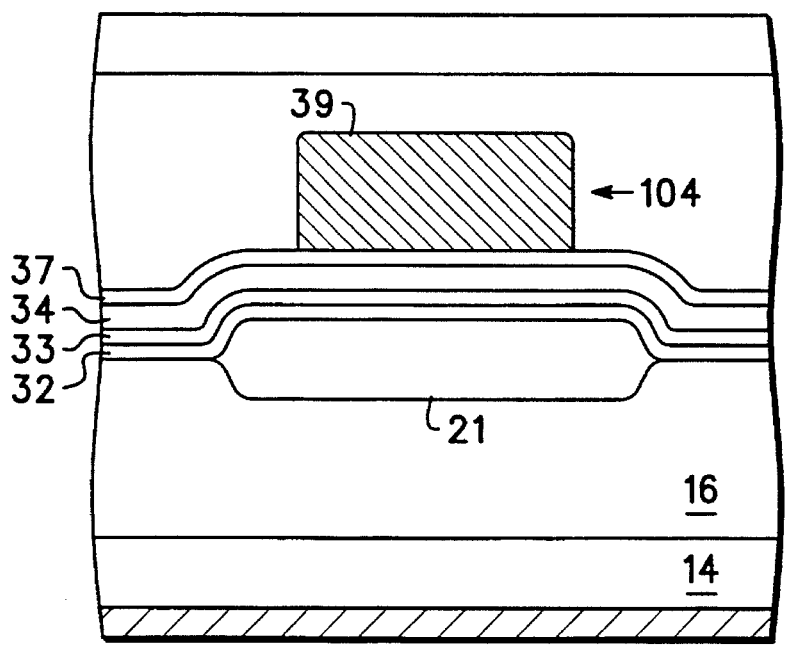
FIG. 13 illustrates still another portion of the logic structure according to the present invention.

Various devices are formed within the isolated active areas and on or above various portions of field passivation regions 21. As shown in FIGS. 2 and 3, these devices include silicon-based high frequency power FET device or LDMOS structure 22, an inductor structure 23, a shunt capacitor structure 24, a transmission line structure 26, an ESD structure 27, a series capacitor structure 28, a logic structure 29, and a resistor structure 31. The portion of logic structure 29 shown in FIG. 3 is an NMOS portion. The balance of logic structure 29 is shown in FIGS. 11–13 and explained in more detail below.

Ohmic or metal layer 39 is used to form both contacts to the various structures and to form portions of some of the structures. Ohmic or metal layer 46 is used to form both contacts to ohmic layer 39 and to form portions of some of the structures. Although single examples of the above structures are shown, it is understood that a device incorporating a plurality of the above structures, all of the above structures, or just a portion of the above structures is possible and such a structure is within the scope of the present invention.

As is apparent from FIGS. 2 and 3, several additional passivation layers are common among the various structures. In a preferred embodiment, a first passivation layer 32 (e.g., silicon oxide, silicon nitride, etc.) is formed over field passivation regions 21, portions of the active regions of second layer 16, and portions of the individual structures. A second passivation layer 33 (e.g., silicon nitride, silicon oxide, etc.) is formed over first passivation layer 32 followed by a first interlayer dielectric layer or ILD0 layer 34. A dielectric layer 37 is formed over ILD0 layer 34 followed by a second interlayer dielectric layer or ILD1 layer 43 and a final passivation layer 44. The elements of each device within structure 10 will now be described in detail followed by a detailed description of a preferred process flow for making structure 10.

High frequency power FET device, high frequency LDMOS power transistor, or LDMOS structure 22 comprises p+ sinker region 36, high voltage or PHV region 56, p+ enhancement region 57, n+ source region 58, NHV region 59, and n+ drain region 61. In an optional embodiment, LDMOS structure 22 further includes a p+ region 42 to provide additional surface ohmic contact enhancement to ohmic layer 39.

P+ sinker region 36 extends from the upper surface of second layer 16 to ground plane layer 14. Preferably, p+ sinker region 36 has a surface concentration of about $1.0 \times 10^{19}$ atoms/cm$^3$ PHV region 56 typically extends into second layer 16 to a depth of about 1.5 to 2.0 microns. The exact dopant profile of PHV region 56 depends on the desired breakdown voltage, threshold voltage, and transconductance characteristics of LDMOS structure 22.

P+ enhancement region 57 typically has a surface concentration in excess of $1.0 \times 10^{18}$ atoms/cm$^3$ and extends into second layer 16 to a depth of about 0.5 to 1.5 microns. In an optional embodiment, p+ enhancement region 57 is not used. N+ source region 58 and n+ drain region 61 typically have a surface concentration on an order of $1.0 \times 10^{20}$ atoms/cm$^3$ and extend into second layer 16 to a junction depth of about 0.1 to 0.5 microns. NHV region 59 typically has a surface concentration on an order of $1.0 \times 10^{17}$ atoms/cm$^3$ and extends into second layer 16 to a depth of about 0.2 to 1.0 microns. P+ region 42 typically has a surface concentration on an order of $5.0 \times 10^{18}$ to $1.0 \times 10^{19}$ atoms/cm$^3$ and extends into second layer 16 to a depth of about 0.1 to 0.7 microns.

A gate electrode is separated from second layer 16 by gate dielectric or oxide layer 63. Preferably, the gate electrode comprises a heavily doped polycrystalline semiconductor layer 64 and an ohmic or metal layer 66 formed on polycrystalline semiconductor layer 64. For example, doped polycrystalline semiconductor layer 64 comprises an n+ polysilicon layer having a thickness of about 4,000 to 6,000 angstroms and ohmic layer 66 comprises a tungsten/silicon alloy layer about 2,500 to 3,500 angstroms thick. Gate oxide layer 63 typically has a thickness in a range from 100 to 600 angstroms with a thickness of about 400 angstroms preferred.

Ohmic layer 39 provides contacts to the source and drain regions of LDMOS structure 22. Ohmic layer 39 typically comprises aluminum, an aluminum alloy, or a multi-layer metallization such as a titanium-tungsten alloy layer followed by an aluminum-copper alloy layer. The multi-layer metallization for ohmic layer 39 provides enhanced protection against electro-migration related failures. Ohmic layer 39 preferably has a thickness in range from 1.2 to 1.5 microns.

Typically, LDMOS structure 22 is designed in an inter-digitated fashion with alternating source and drain regions. Also, LDMOS structure 22 is conveniently integrated into a 56 gate cell design (28 drain regions and 28 source regions). A four cell structure comprising four of the above 56 gate cells integrated together is sufficient to provide an RF power output of about 1 to 2 watts at 6 volts and about 1 GHz.

Inductor structure 23 is formed above one of field passivation regions 21. In the embodiment shown, inductor structure 23 is formed on dielectric layer 37 and preferably comprises a multi-layer metallization structure including ohmic layer 39. ILD1 layer 43 covers ohmic layer 39 and contains openings so that a second ohmic layer 46 contacts ohmic layer 39 to complete the structure. Ohmic layer 46 preferably comprises aluminum or an aluminum alloy such as an aluminum-copper-silicon alloy and preferably has a thickness in range from about 1.8 to 2.0 microns.

By using ohmic layer 39 as part of inductor structure 23, less processing steps are required compared to when a metal different than that used in the other structures is used in the inductor structures. Also, because field passivation regions 21, first passivation layer 32, second passivation layer 33, ILDO layer 34, and dielectric layer 37 isolate inductor structure 23 from ground plane layer 14, an inductor structure having a high Q characteristic is achieved (where Q is typically referred to as a quality factor of a component and defined as energy stored in the magnetic field over energy dissipated). In addition, the two level metallization (i.e., ohmic layer 39 and ohmic layer 46) stack provides a lower parasitic resistance thereby further enhancing the Q characteristic of inductor structure 23.

Figure 4:
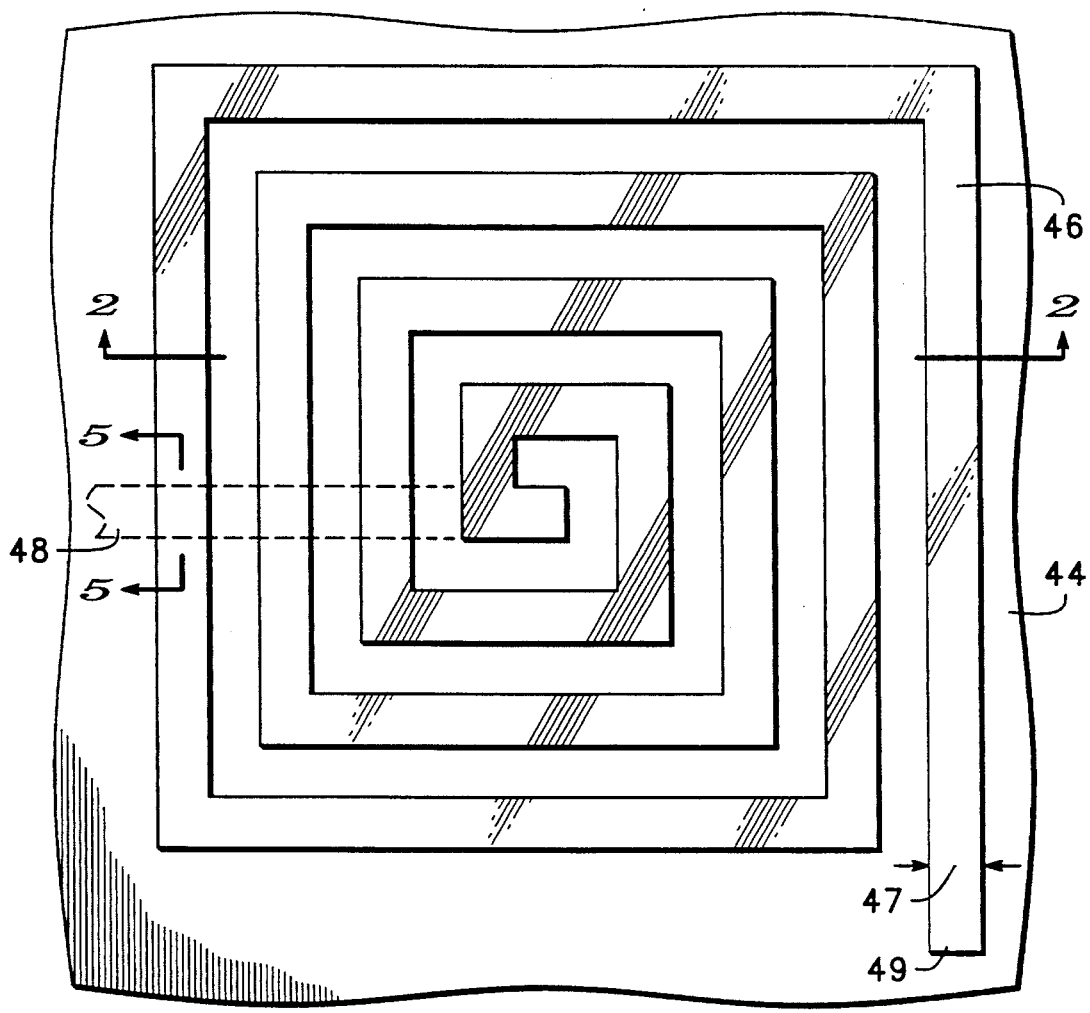
FIG. 4 illustrates an enlarged top view of the inductor structure shown in FIG. 2.

FIG. 4 is a highly enlarged top view of an example of a design for inductor structure 23. As shown in FIG. 4, inductor structure 23 typically comprises a well known spiral or coil shape with a centrally located core. Reference line 2—2 is provided to show the relative location of the cross-section of inductor structure 23 shown in FIG. 2. Inductor structure 23 includes a first terminal or center tap line 48 and a second terminal 49. First terminal 48 provides a connection to the core of inductor structure 23.

First terminal 48 is shown in phantom because it is beneath ILD1 layer 43 in this embodiment. This is more apparent in FIG. 5-1 described below. The design of inductor structure 23 shown in FIG. 4 is sufficient for providing an inductance value on the order of 6 to 7 nanohenries, with each line having a width 47 in a range from approximately 15 to 30 microns and with each line spaced a distance of approximately 3 to 10 microns apart.

Figures 1, 5:
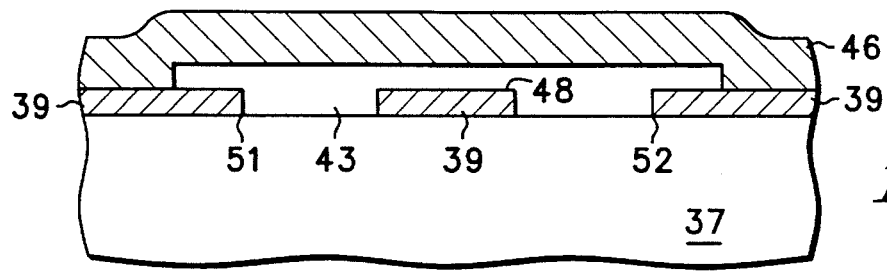
Figures 2, 5:
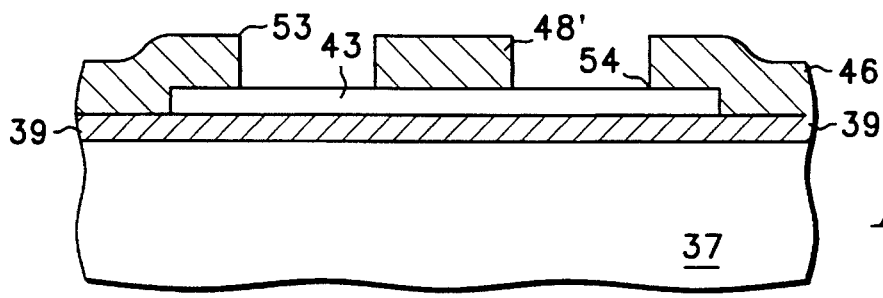

FIG. 5-1 is an enlarged cross-sectional view of a portion of inductor structure 23 taken along reference line 5—5 shown in FIG. 4. FIG. 5-1 is provided to show one embodiment for connecting first terminal 48 to the core of inductor structure 23. Ohmic layer 39 terminates at points 51 and 52 thereby forming a gap to allow for the formation of first terminal 48. ILD1 layer 43 isolates first terminal 48 from ohmic layer 46 and ohmic layer 46 serves to "bridge" the gap created by points 51 and 52. This design eliminates the need for using an air bridge connective structure thus reducing process complexity.

FIG. 5-2 is an enlarged cross-sectional view of another embodiment of a portion of an inductor structure according to the present invention. In this embodiment, ohmic layer 46 terminates at points 53 and 54 thereby forming a gap to allow for a first terminal 48' to connect to the core of the inductor structure. ILD1 layer 43 isolates first terminal 48' from ohmic layer 39 and ohmic layer 39 serves to "bridge" the gap created by points 53 and 54.

In an alternative embodiment, the inductor structure comprises a spiral design with only ohmic layer 46 used to form the spiral. Ohmic layer 39 forms the center tap line with ILD1 layer 43 separating the center tap line from ohmic layer 46. A via located at or near the core is used to connect ohmic layer 46 to the center tap line. This alternative design provides an inductor structure that is further isolated from ground plane layer 14 thereby further lowering capacitance effects. However, this alternative design has a higher series resistance effect compared to inductor structure 23 shown in FIG. 2 because only ohmic layer 46 is used. This may be overcome by increasing the thickness of ohmic layer 46.

Referring now back to FIG. 2, shunt capacitor structure 24 includes a p+ sinker region 136 that provides a highly doped connection between the upper surface of second layer 16 and ground plane layer 14. In addition, p+ sinker region 136 forms the bottom plate of shunt capacitor structure 24. P+ sinker region 136 has the same dopant profile characteristics as p+ sinker region 36. Dielectric layer 37 forms the capacitor dielectric and preferably comprises a silicon nitride layer having a thickness less than approximately 1,100 angstroms. Optionally, dielectric layer 37 comprises a silicon oxide, a combination of silicon oxide and silicon nitride, or other high dielectric constant materials. Ohmic layer 39 forms the top plate of shunt capacitor structure 24.

The capacitance value of shunt capacitor structure 24 is determined, for example, by adjusting the cross-sectional area of opening 41. For example, to provide an 85 picofarad shunt capacitor, the cross-sectional area of opening 42 is approximately 400 by 400 square microns when dielectric layer 37 comprises silicon nitride and has a thickness of approximately 1,000 angstroms.

Transmission line structure 26 preferably comprises a multi-layer metallization transmission line configuration that includes ohmic layers 39 and 46. Ohmic layer 39 is formed on dielectric layer 37 and ohmic layer 46 is formed on ohmic layer 39. Openings formed in ILD1 layer 43 allow ohmic layer 46 to contact ohmic layer 39. Typically, each transmission line has a width 68 of about 15 to 30 microns to provide a transmission line having a characteristic impedance on the order of 70 to 30 ohms respectively. Typically, adjacent transmission lines are spaced apart a distance 69 of about 10 to 20.

By placing transmission line structure 26 on dielectric layer 37 and above ILDO layer 34, second passivation layer 33, first passivation layer 32, and one of field passivation regions 21, a high dielectric constant transmission line structure is provided. As a result, this design allows for shorter transmission lines, which in turn saves on space and costs.

Referring now to FIG. 3, ESD structure 27 is described. In high frequency applications, an ESD structure must not introduce noise into the circuit, limit the high frequency signal swing, consume excessive dc power, or consume a large area. In addition, LDMOS structure 22 typically fails an ESD human body model test at about 50 volts without ESD protection.

ESD structure 27 is one example according to the present invention that meets the above requirements without adding process steps. ESD structure 27 is used, for example, at the RF input portion of the high frequency integrated circuit. ESD structure 27 comprises a shunt diode configuration having a breakdown voltage of about 9 volts and a turn-on voltage of about 0.5 to 0.6 volts.

In particular, ESD structure 27 preferably comprises an annular structure including p+ sinker region 236, high voltage or PHV region 156, p+ enhancement region 157, and n+ region 71. P+ sinker region 236, PHV region 156, and p+ enhancement region 157 have the same dopant profile and depth characteristics as p+ sinker region 36, PHV region 56, and p+ enhancement region 57 respectively. Preferably, n+ region 71 is doped twice, first at the same time as NHV region 59 and second, at the same time as n+ source region 58. This provides n+ region 71 with a graded junction profile and thus a higher breakdown voltage. P+ sinker region 236 conveniently provides an anode connection to ground plane layer 14 for ESD structure 27. Ohmic layer 39 provides a cathode ohmic contact to n+ region 71.

To provide optimum protection and to minimize the impact of the presence of ESD structure 27 on the rest of the integrated circuit, ESD structure 27 preferably has a round geometry with p+ enhancement region 157 and p+ sinker region 236 forming rings around n+ region 71. N+ region 71 preferably has a diameter 72 of about 4 to 5 microns. ESD structure 27 preferably has an overall active area diameter 73 of about 30 microns.

ESD structure 27 does not introduce measurable noise into the balance of the integrated circuit and is small enough not to interfere with the interstage matching circuitry. In addition, ESD structure 27 provides a measured human body protection of up to about 500 volts and limits the negative RF voltage swing to approximately −0.5 volts (approximately 3 dBm) if placed directly in series with the RF input pad. ESD structure 27 conveniently utilizes the processing steps used to form LDMOS structure 22 thus providing cost effective integration.

Figure 6:
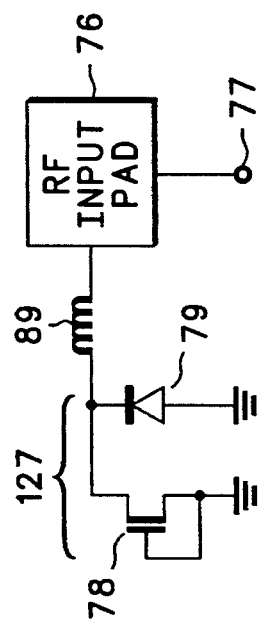
FIG. 6 is a circuit diagram of another embodiment of an ESD structure according to the present invention.

FIG. 6 is a circuit diagram of an additional embodiment of an ESD structure 127 according to the present invention. ESD structure 127 is coupled to RF input pad 76 and includes an NMOS transistor 78 and a diode 79. As shown in FIG. 6, NMOS transistor 78 is in a shorted gate/source configuration. Typically, an output terminal 77 is coupled to RF input pad 76 for connecting RF input pad 76 to the balance of the high frequency integrated circuit. The circuit diagram also includes an optional inductor 89 coupled in series between diode 79 and RF input pad 76. As is explained in more detail below, inductor 89 provides a high frequency series resistance to improve performance during a negative RF voltage swing.

Figure 7:
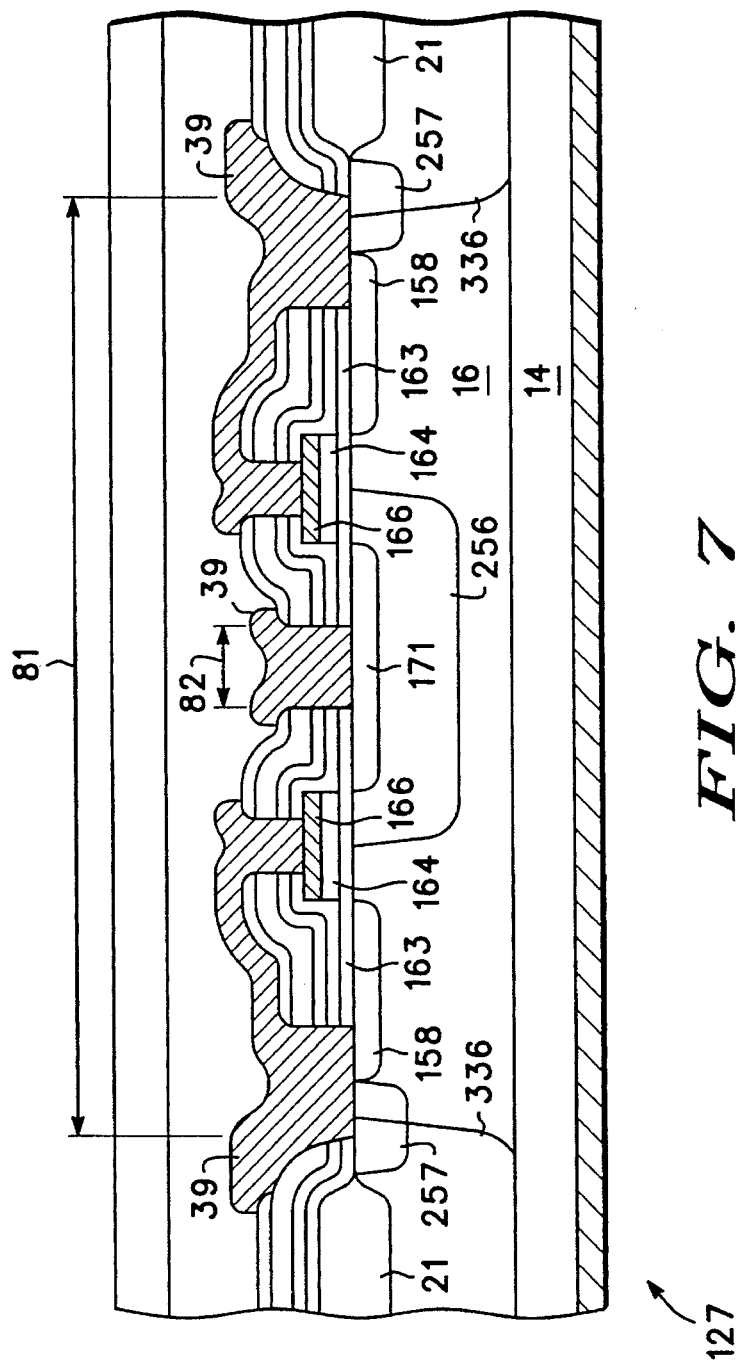
FIG. 7 illustrates an enlarged cross-sectional view of the ESD structure according to FIG. 6.

FIG. 7 illustrates an enlarged cross-sectional view of ESD structure 127 according to FIG. 6. ESD structure 127 preferably comprises an annular design and includes p+ sinker region 336, p+ enhancement region 257, n+ source region 158, and n+ region 171. N+ region 171 functions as both the cathode of diode 79 and the drain of NMOS transistor 78. Optionally, ESD structure 127 includes a high voltage or PHV region 256. P+ sinker region 336, p+ enhancement region 257, n+ source region 158, and PHV region 256 have the same dopant profile and depth characteristics as p+ sinker region 36, p+ enhancement region 57, n+ source region 58, and PHV region 56 respectively.

Preferably, like n+ region 71, n+ region 171 is doped twice, first at the same time as NHV region 59 and second, at the same time as n+ source region 58. This provides n+ region 171 with a graded junction profile and thus a higher breakdown voltage. P+ sinker region 336 provides a convenient connection to ground plane layer 14 for ESD structure 127. With PHV region 256, diode 79 has a breakdown voltage of approximately 9 volts. Without PHV region 256, diode 79 has a breakdown voltage in excess of 45 volts.

ESD structure 127 further includes gate oxide layer 163, polycrystalline semiconductor layer 164, and ohmic or metal layer 166. Polycrystalline semiconductor layer 164 and ohmic layer 166 form a gate control electrode. Gate oxide layer 163, polycrystalline semiconductor layer 164, and ohmic layer 166 preferably are formed at the same time as gate oxide layer 63, polycrystalline semiconductor layer 64, and ohmic layer 166. Ohmic layer 39 provides an ohmic contact between the gate control electrode and n+ source region 158 and provides a cathode/drain ohmic contact to n+ region 171.

Preferably, NMOS transistor 78 has a channel length of approximately 2 to 4 microns. With the above dopant profiles, NMOS transistor 78 has a threshold voltage of about 0.3 volts and a breakdown voltage of about 10 volts. Preferably, ESD structure 127 has a width 81 of about 40 microns. In an optional embodiment, ESD structure 127 includes a PHV region around n+ source region 158 and p+ enhancement region 257. In this optional embodiment, the channel length optionally is reduced to about 1 micron to provide a structure having a threshold voltage of about 1.5 volts and a breakdown voltage of about 12 to 15 volts.

During a positive voltage spike, the NMOS portion of ESD structure 127 is designed to breakdown for voltages above 9–12 volts (depending upon if PHV region is used in the NMOS portion). Also, the diode portion of ESD structure 127 is designed to breakdown during a positive voltage spike for voltages above 9 volts (when PHV region 256 is used) to provide an additional conduction path. When PHV region 256 is not used, the diode portion has a breakdown voltage in excess of 45 volts and provides an additional conduction path during high level positive voltage spikes.

During negative voltage spikes, the drain-to-body junction (i.e., the junction formed by n+ region 171 and second layer 16 or PHV region 256) becomes forward biased for bias conditions lower than approximately −0.6 volts. ESD structure 127 has a measured human body protection to approximately 750 volts and limits the negative RF voltage swing to approximately −0.5 volts (approximately 3 dBm).

To improve the performance of ESD structure 127 during a negative RF voltage swing, inductor 89 (shown in FIG. 6) is placed in series between RF input pad 76 and diode 79. Inductor 89 provides a high frequency series resistance thereby reducing the sensitivity of the ESD structure during the negative RF voltage swing. Preferably, inductor 89 has an inductance value of about 5 to 10 nanohenries. Inductor 89 is similarly used with ESD structure 27 discussed above and 227 discussed below to likewise improve performance during an negative RF voltage swing. Like ESD structure 27, ESD structure 127 conveniently utilizes the processing steps used to form LDMOS structure 22 thus providing cost effective integration.

Figure 8:
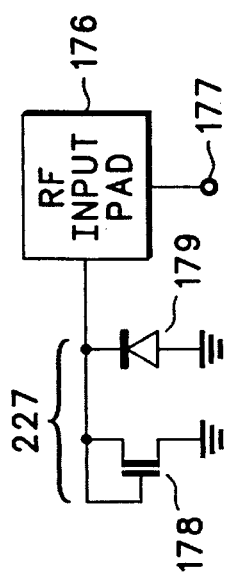
FIG. 8 is a circuit diagram of an additional embodiment of an ESD structure according to the present invention.

FIG. 8 is a circuit diagram of an additional embodiment of an ESD structure 227 according to the present invention. ESD structure 227 is coupled to RF input pad 176 and includes an NMOS transistor 178 and a diode 179. As shown in FIG. 8, NMOS transistor 178 is in a shorted gate/drain configuration. An output terminal is coupled to RF input pad 176 for connecting RF input pad 76 to the balance of the high frequency integrated circuit.

Figure 9:
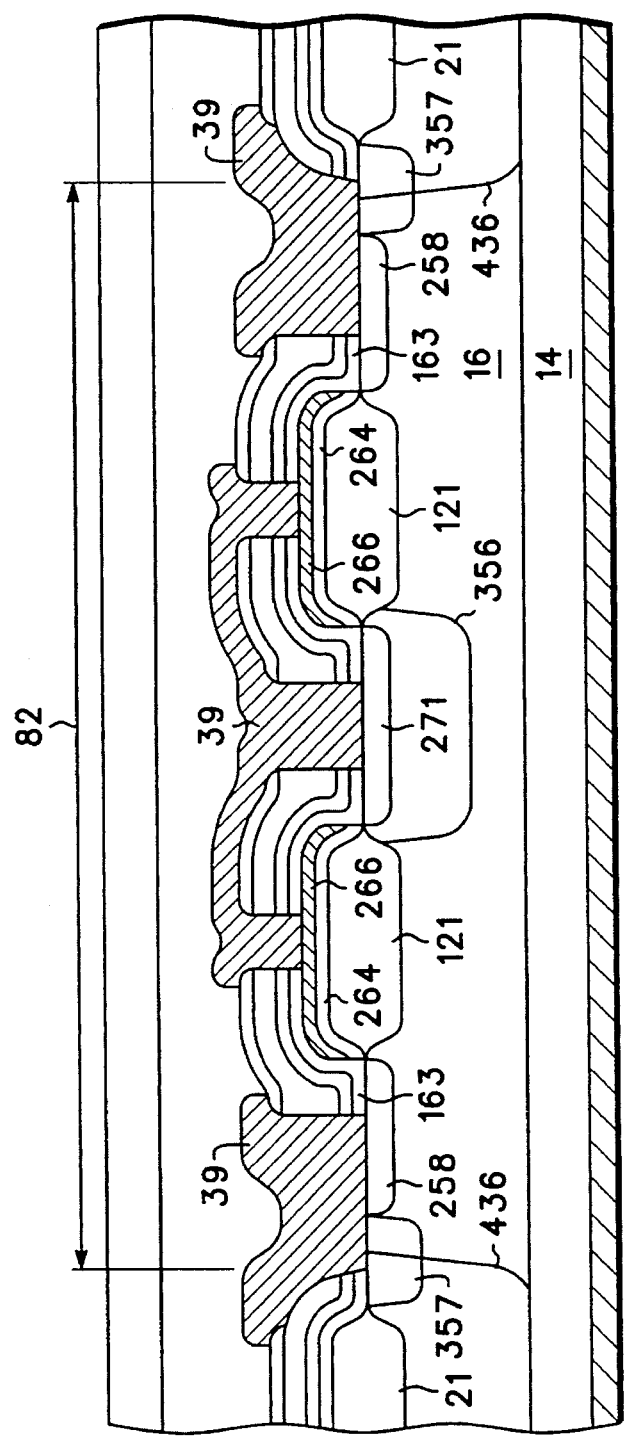
FIG. 9 illustrates an enlarged cross-sectional view of the ESD structure according to FIG. 8.

FIG. 9 illustrates an enlarged cross-sectional view of ESD structure 227 according to FIG. 8. ESD structure 227 preferably comprises an annular design and includes p+ sinker region 436, p+ enhancement region 357, n+ source region 258, and n+ region 271. N+ region 271 functions as both the cathode of diode 179 and the drain of NMOS transistor 178. Like ESD structure 127, ESD structure 227 optionally includes a high voltage or PHV region 356. P+ sinker region 436, p+ enhancement region 357, n+ source region 258, and PHV region 356 have the same dopant profile and depth characteristics as p+ sinker region 36, p+ enhancement region 57, n+ source region 58, and PHV region 56 respectively.

Preferably, like n+ region 71, n+ region 271 is doped twice, first at the same time as NHV region 59 and second, at the same time as n+ source region 58. This provides n+ region 271 with a graded junction profile and thus a higher breakdown voltage. With PHV region 356, diode 179 has a breakdown voltage of approximately 9 volts. Without PHV region 356, diode 179 has a breakdown voltage in excess of 45 volts. NMOS transistor 178 has a breakdown voltage of about 10 to 12 volts.

ESD structure 227 further includes thick gate oxide regions 121 that are formed at the same time as field passivation regions 21. Thick gate oxide regions 121 thus have a thickness in excess of about 1.8 microns. A gate electrode layer is formed over thick gate oxide regions 121 and preferably comprises a heavily doped polycrystalline semiconductor layer 264, and an ohmic or metal layer 266. Polycrystalline semiconductor layer 264, and ohmic layer 266 preferably are formed at the same time as polycrystalline semiconductor layer 64 and ohmic layer 66. Ohmic layer 39 provides an ohmic contact between the gate control electrode and n+ region 271 and provides an ohmic contact to n+ source region 258.

With thick gate oxide regions 121, NMOS transistor 178 has a threshold voltage of approximately 7 volts. Preferably, NMOS transistor 178 has a channel length of about 5 to 10 microns. ESD structure 227 preferably has an active area width 82 of about 50 microns.

During a positive voltage spike the NMOS portion of ESD structure 227 is designed to conduct at voltages above about 7 volts. When PHV region 356 is used, the diode portion contributes to conduction at voltages above about 9 volts. When PHV region 356 is not used, the diode portion contributes to conduction during high level spikes in excess of 45 volts. During negative voltage spikes, the drain-to-body junction (i.e., the junction formed by n+ region 271 and second layer 16 or PHV region 356) becomes forward biased for bias conditions below approximately −0.6 volts.

ESD structure 227 has a predicted measured human body protection to approximately 750 volts and a negative RF swing limitation of approximately −0.5 volts (approximately 3 dBm). And like ESD structure 27, ESD structure 227 utilizes the processing steps used to form LDMOS structure 22 thus providing cost effective integration.

Optionally, ESD structures 27, 127, and/or 227 are combined into a single ESD structure to provide additional ESD protection. Alternatively, ESD structures 27, 127, and 227 are connected to ground through a centrally located p+ sinker region, with the other regions formed around the p+ sinker. Optionally, ESD structures 27, 127, and/or 227 are used to protect the gate bias ($V_{GG}$) and drain bias ($V_{DD}$) input portions of the monolithic high frequency integrated circuit structure.

Referring back to FIG. 3, series capacitor structure 28 will now be described. Series capacitor structure 28 is formed above one of field passivation regions 21. This places it away from ground plane layer 14 thus reducing parasitic problems and improving the Q characteristics of the component. Preferably, and as shown in FIG. 3, the bottom or first plate of series capacitor 28 comprises a heavily doped polycrystalline semiconductor layer 364 and an ohmic or metal layer 366 formed over polycrystalline semiconductor layer 364. Preferably, polycrystalline semiconductor layer 364 and ohmic layer 366 comprise the same materials as polycrystalline semiconductor layer 64 and ohmic layer 66 and preferably are formed at the same time.

First and second passivation layers 32 and 33 and ILDO layer 34 cover portions of the bottom plate and openings (e.g., opening 86) are formed to expose ohmic layer 366. Dielectric layer 37 is formed in opening 86 to provide the capacitor dielectric. Dielectric layer 37 preferably comprises a silicon nitride, a silicon oxide, a combination thereof, or a high dielectric constant material. Preferably, dielectric layer 37 has a thickness less than about 1,100 angstroms.

As will be explained in more detail below, ILDO layer 34 is exposed to a reflow process after the contact openings (e.g., opening 86) are formed to reduce stress cracking in dielectric layer 37 during and after its formation. By reflowing ILDO layer 34, the sidewalls of the openings take on a graded characteristic so that there is minimal profile change during the formation of dielectric layer 37 and/or during subsequent processing.

Ohmic layer 39 forms both a top or second plate of series capacitor structure 28 and a provides a contact to the bottom plate. The actual capacitance value of series capacitor structure 28 is easily controlled by the cross-sectional area of opening 86. For example, to provide a capacitance value of about 85 picofarads, opening 86 has a cross-sectional area of about 400 by 400 square microns when dielectric layer 37 comprises about 1,000 angstroms of silicon nitride. By using ohmic layer 366, parasitic resistance is reduced in series capacitor structure 28 thereby providing a high Q and improving frequency response.

Logic structure 29 shown in FIG. 3 includes a CMOS based logic design. The incorporation of logic devices into a high frequency LDMOS process represents significant design challenges. The design of LDMOS structure 22 requires that the NMOS portion of the CMOS logic be in a grounded source configuration unless additional process steps are added to the process flow. Also, because LDMOS structure 22 has a large body effect, it is impractical to float the source as is typically done in standard CMOS processing. In addition, the LDMOS design requires thick field passivation regions, a heavily doped p-type ground plane layer (i.e., substrate), and a topside ground via (i.e., a p+ sinker design).

In view of the above design constraints, the logic structure according to the present invention achieves the integration of logic devices into the LDMOS flow with the addition of one step to form n-wells for the PMOS portion. The logic structure is realized using the LDMOS device as the NMOS device in a CMOS implementation and using a top sinker ground contact to the substrate thereby greatly simplifying ohmic contact routing.

Logic structures according to the present invention are used, for example, to provide programmable switches and signal attenuator devices. By way of example only, the logic structure according to the present invention will be described in the form of an inverter cell. As those skilled in the art will recognize, the formation of other NOR based logic cells is easily achieved given the inverter cell configuration.

Figures 1, 10:
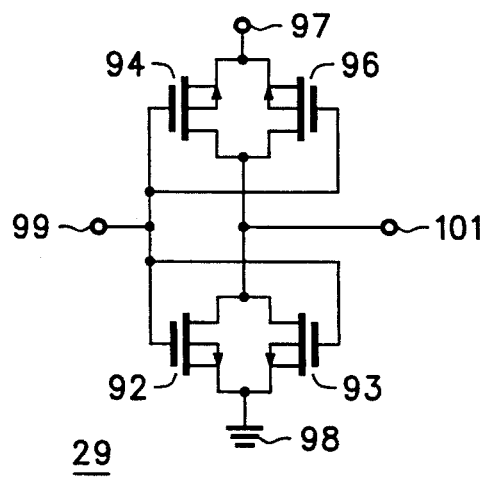
Figures 2, 10:
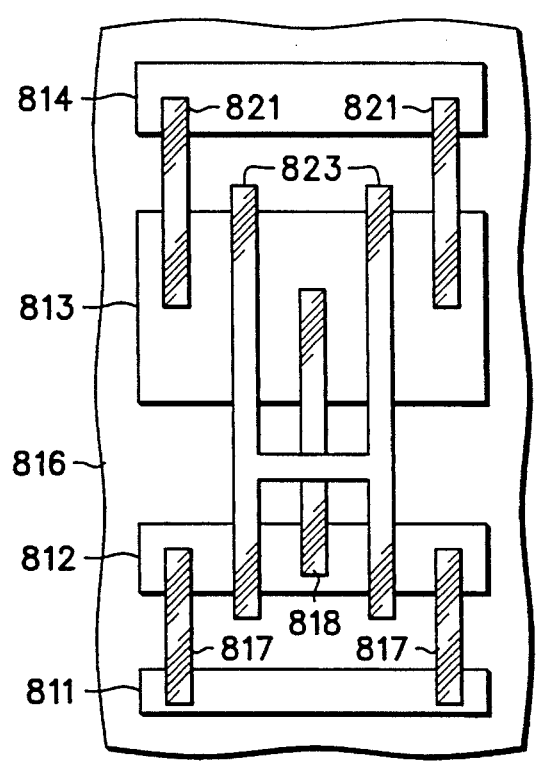

FIG. 10-1 is a circuit diagram of logic structure 29 (i.e., an inverter cell) shown in FIGS. 3 and 11–13. Logic structure 29 includes a first NMOS transistor 92 and a second NMOS transistor 93, both in a grounded source configuration. Logic structure 29 further includes first PMOS transistor 94, second PMOS transistor 96, $V_{DD}$ terminal or portion 97, ground contact terminal or portion 98, $V_{in}$ terminal 99, and $V_{out}$ terminal 101. The portion of logic structure 29 shown in FIG. 3 is the NMOS portion. The PMOS portion is shown in FIG. 11, ground contact portion 98 is shown in FIG. 11, and $V_{DD}$ portion 97 is shown in FIG. 12.

Referring now to FIG. 3, the NMOS portion of logic structure 29 includes high voltage or PHV regions 456, p+ regions 102, n+ source regions 158, n+ drain region 161, and gate oxide layers 263. PHV regions 456, n+ source regions 158, and n+ drain region 161 preferably comprise the same dopant profile and depth characteristics as PHV region 56, n+ source region 58, and n+ drain region 61 respectively. P+ regions 102 preferably have the same dopant characteristics as p+ region 42.

Gate oxide layers 263 are formed at the same time as gate oxide layer 63. The gate control electrodes for the NMOS portion preferably comprise a heavily doped polycrystalline semiconductor layer 464 and an ohmic or metal layer 466, which preferably comprise the same materials as polycrystalline semiconductor layer 64 and ohmic layer 66. Preferably, polycrystalline semiconductor layer 464 and ohmic layer 466 are formed at the same time as polycrystalline semiconductor layer 64 and ohmic layer 66.

First and second passivation layers 32 and 33, ILDO layer 34, and dielectric layer 37 cover the gate control electrodes and ohmic layer 39 provides the source contacts and the drain contact. Preferably, first NMOS transistor 92 and second NMOS transistor 93 have a channel length of about 1.5 microns and a channel width of about 20 microns.

Referring now to FIG. 11, the PMOS portion of logic structure 29 comprises n-well 103, n+ regions 371, p+ source regions 202, and p+ drain region 203. N-well 103 has a surface dopant concentration of about $5.0 \times 10^{16}$ to $5.0 \times 10^{17}$ atoms/cm$^3$ and extends into second layer 16 to a depth of about 1.7 to 2.5 microns. N+ regions 371 have the same dopant profile and depth characteristics as n+ source region 58. P+ source regions 202 and p+ drain region 203 have the same dopant profile and depth characteristics as p+ region 42. Gate oxide layers 363 separate the gate control electrodes for the PMOS portion from second layer 16. Gate oxide layers 363 preferably are formed at the same time as gate oxide layer 63.

The gate control electrodes for the PMOS portion preferably include heavily doped polycrystalline semiconductor layers 564 and ohmic or metal layers 566. Preferably, polycrystalline semiconductor layers 564 and ohmic layers 566 comprise the same materials as polycrystalline semiconductor layer 64 and ohmic layer 66 respectively.

First and second passivation layers 32 and 33, ILDO layer 34, and dielectric layer 37 cover the gate control electrodes and ohmic layer 39 provides contacts to p+ source regions 202 and p+ drain region 203. Preferably, first PMOS transistor 94 and second PMOS transistor 96 have a channel length of about 1.5 microns and a channel width of about 1.5 to 2.5 times the channel width of NMOS transistors 92 and 93.

FIG. 12 illustrates an enlarged cross-sectional view of ground contact portion 98 of logic structure 29 according to the present invention. Ground contact portion 98 includes p+ sinker region 536, high voltage or PHV region 556, p+ enhancement region 457, and p+ region 142. Ohmic layer 39 provides the connection from the NMOS portion to ground. P+ sinker region 536, PHV region 556, p+ enhancement region 457, and p+ region 142 have the same dopant profile characteristics as p+ sinker region 36, PHV region 56, p+ enhancement region 57, and p+ region 42 respectively. Ground contact portion 98 provides a convenient top side ground connection thereby greatly simplifying top side ohmic layer routings. FIG. 13 illustrates an enlarged cross-sectional view of $V_{DD}$ portion 97 Of logic structure 29 according to the present invention. $V_{DD}$ portion 97 includes $V_{DD}$ pad 104 formed on dielectric layer 37. $V_{DD}$ pad 104 preferably comprises the same material as ohmic layer 39.

FIG. 10-2 is a top view representation of a preferred logic cell layout 810 according to the present invention. Preferably, each logic cell begins with ground tie portion 811, an NMOS portion 812 is adjacent ground tie portion 811, a PMOS portion 813 is adjacent NMOS portion 812, and a $V_{DD}$ bus 814 is adjacent PMOS portion 813. Gate lines 823 access gate regions in NMOS portion 812 and PMOS portion 813. Signal line 818 accesses drain regions in NMOS portion 812 and PMOS portion 813. An interconnect portion 816 is between NMOS portion 812 and PMOS portion 813. Signal and gate connections are conveniently made, for example, in interconnect portion 816.

Preferably, NMOS portion 812 and PMOS portion 813 have the same pitch so that gate lines 823 conveniently access both portions in a linear manner. This is easily achieved with ground tie portion 811 placed external to NMOS portion 812. By laying the cells out in this linear manner, additional logic cells are easily cascaded onto each other to produce additional logic functions.

As shown in FIG. 10-2, NMOS portion 812 preferably starts and ends with a ground tie 817 and has a signal tie 818 between a pair of ground ties. That is, each NMOS portion 812 preferably is provided in an ground/signal/ground configuration. Each PMOS portion 813 preferably starts and ends with a $V_{DD}$ tie 821 and has signal tie 818 between a pair of $V_{DD}$ ties. That is, each PMOS portion 813 preferably is provided in a $V_{DD}$/signal/$V_{DD}$ configuration. This configuration further simplifies the cascading of logic cells to support more complex logic functions. In addition, layout 810 allows the implementation of more complex logic cells by standard mirroring techniques.

The logic cell structure according to the present invention is suitable for standard logic cell layouts. For example, it supports a 10× output buffer, a 2 and 3 input NOR, a 2 and 3 input NAND, a XOR, a NXOR, a simple latch/buffer with enable, a J-K flip flop, a 2 input OR, a 2 input AND, and decoding/demultiplexing designs.

In a NOR based design, the PMOS devices are coupled together in series and the NMOS devices are coupled together in parallel because of the grounded source constraint imposed by LDMOS structure 22. Preferably, no more than 3 devices are cascaded because of the impact of the cascaded PMOS devices on rise time. For example, in a 3 input NOR design rise time is about 2.5 nanoseconds, which supports a clocking cycle in excess of 100 MHz.

Referring back to FIG. 3, resistor structure 31 is now described. Resistor structure 31 preferably is formed on one of field passivation regions 21 and preferably comprises a multi-layer configuration. In particular, resistor structure 31 preferably comprises a heavily doped polycrystalline semiconductor layer 664 and a ohmic or metal layer 766. Polycrystalline semiconductor layer 664 and ohmic layer 766 are preferably formed at the same time as polycrystalline semiconductor layer 64 and ohmic layer 66. The resistance of resistor structure 31 is controlled by its length using well known resistor patterns and/or by its width. Optionally, a resistor structure is formed in an additional active area of second layer 16 using conventional doping techniques.

Figure 14:
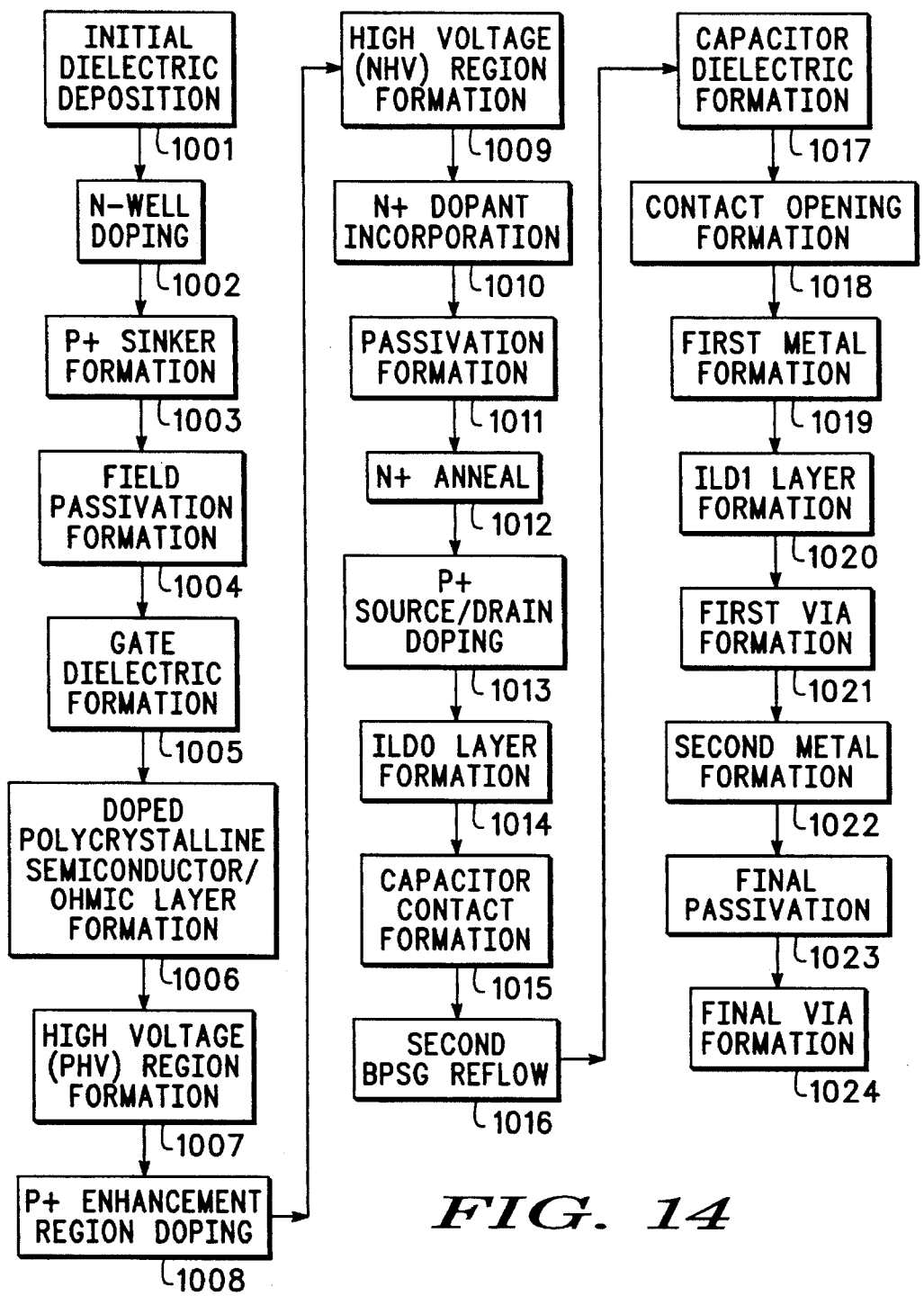
FIG. 14 illustrates a flow diagram for a preferred method according to the present invention.

A preferred method for making structure 10 is now described in conjunction with FIG. 14. Unless otherwise noted, a $B^{11}$ boron source is suitable for the boron ion implantation steps discussed below. Also, the elements of all the structures mentioned above, including ESD structures 27, 127, and 227 are included in the process described below for convenience. It is understood that structure 10 may include LDMOS structure 22 together with a portion of or all of the above disclosed structures, and the following description is not intended to be limiting.

During step 1001, an initial oxide layer is formed on upper layer 16. This oxide layer preferably has thickness in a range from 500 to 1,500 angstroms. Next, n-well 103 is formed for the PMOS portion of logic structure 29 as represented by step 1002. N-well 103 is formed using conventional patterning and dopant techniques. Preferably, n-well 103 is formed using phosphorous ion implantation with a dose on an order of $1.0 \times 10^{12}$ to $5.0 \times 10^{12}$ atoms/cm$^2$ and an implant energy on an order of 100 to 150 keV suitable. The implanted dopant preferably is driven into second layer 16 at the same time as the p+ sinker regions as described below. Step 1001 is skipped when CMOS logic structures are not included in structure 10.

Next, p+ sinker regions 36, 136, 236, 336, 436, and 536 are formed preferably using boron ion implantation as represented by step 1003. A boron implant dose in a range from about $5.0 \times 10^{15}$ to $1.0 \times 10^{16}$ atoms/cm$^2$ and an implant energy in range from 50 to 100 keV is suitable. After boron implantation, structure 10 is exposed to an elevated temperature of about 1100° to 1200° C. for 80 to 150 minutes in a low $O_2$ ambient to form n-well 103 and p+ sinker regions 36, 136, 236, 336, 436, and 536.

Next, field passivation regions 21 (and 121 when ESD structure 227 is used) are formed as represented by step 1004 using a conventional LOCOS process. First, initial oxide from step 1001 is removed, then approximately 600 to 1,000 angstroms of pad oxide is formed, and about 1,000 to 2,000 angstroms of nitride is formed on the pad oxide, preferably using low pressure chemical vapor deposition (LPCVD). Next the passivation stack is patterned to expose those portions of second layer 16 that will be passivated. Conventional photolithography and etch techniques are used to pattern the passivation stack.

Next, field passivation regions 21 are formed, preferably using a high pressure oxidation process and having a thickness in a range from 1.8 to 5 microns. Finally, a standard oxide/nitride/oxide etch sequence is used to provide a plurality of active areas in second layer 16. These active areas are isolated or segregated from each other by field passivation regions 21.

In step 1005, gate oxide layers 63, 163, 263, and 363 are formed. First, a sacrificial oxide layer preferably is formed and subsequently etched to provide a clean upper surface on second layer 16. A sacrificial oxide layer of about 200 to 700 angstroms is suitable. Next a gate oxide layer is formed using conventional silicon oxide formation techniques. Preferably, a thickness of about 100 to 600 angstroms is used. The gate oxide layer is then patterned using conventional techniques to form gate oxide layers 63, 163, 263, and 363.

In step 1006, the gate electrode layers, the series capacitor bottom plate layers, and the resistor layers are formed. First, an LPCVD polysilicon layer is formed with thickness of about 4,000 to 6,000 angstroms. The polysilicon layer is then doped using, for example, a conventional n-type (e.g., phosphorous) ion implant and dopant redistribution process.

Next, an ohmic layer is formed on the polysilicon layer. Preferably, a tungsten/silicon alloy layer is formed using sputtering techniques and a tungsten/silicon alloy target. A tungsten/silicon alloy layer about 2,500 to 3,500 angstroms thick is suitable. Other ohmic layers are suitable including titanium, titanium-nitride, molybdenum, or the like. In addition, low temperature metals such as aluminum and platinum are used, but are preferably formed after high temperature processing has been completed.

Next, the metal layer and polysilicon layer are patterned using conventional processing to form polycrystalline semiconductor layers 64, 164, 264, 364, 464, 564, and 664 and ohmic layers 66, 166, 266, 366, 466, 566 and 766. After the layers are patterned, a thin oxide is formed on ohmic layers 66, 166, 266, 366, 466, 566, and 766. Preferably, a thin oxide of about 150 to 200 angstroms is formed to promote adhesion between ohmic layers 66, 166, 266, 366, 466, 566, and 766 and layers subsequently formed over them and to provide a lower resistance.

In step 1007, PHV regions 56, 156, 256, 356, 456, and 556 are formed. Preferably, boron ion implantation and a patterned photoresist masking layer are used to selectively provide dopant for the PHV regions. A boron implant dose in a range from $1.0 \times 10^{13}$ and $3.0 \times 10^{13}$ atoms/cm$^2$ and an implant energy of about 30 to 70 keV is suitable. Next, a high temperature furnace process comprising a temperature of about 1000° to 1200° C., a time of about 20 to 60 minutes, and a low $O_2$ ambient is used, for example, to redistribute the dopant into second layer 16 to form PHV regions 56, 156, 256, 356, 456, and 556.

In step 1008, dopant for p+ enhancement regions 57, 157, 257, 357, and 457 is selectively introduced into second layer 16. Preferably, boron ion implantation and a patterned photoresist masking layer are used. A boron implant dose in a range from $2.0 \times 10^{14}$ to $5.0 \times 10^{14}$ atoms/cm$^2$ and an implant energy of about 30 to 60 keV is suitable.

During step 1009, NHV region 59 of LDMOS structure 22 is formed. Also, the dopant for p+ enhancement regions 57, 157, 257, 357, and 457 is redistributed to form these regions. Preferably, an arsenic ion implant and patterned photoresist masking layer are used to provide n-type dopant for NHV region 59. An arsenic implant dose in a range from about $1.0 \times 10^{12}$ to $3.5 \times 10^{12}$ atoms/cm$^2$ and an implant energy of about 100 to 150 keV is suitable. Following the arsenic implant, the n-type and p-type dopants are redistributed into second layer 16 to form the respective regions. A furnace process comprising a temperature of about 1000° to 1100° C., a time of about 40 to 90 minutes, and a low $O_2$ ambient is suitable.

In step 1010, n-type dopant is incorporated for n+ source regions 58, 158, and 258, n+ drain regions 61 and 161, and n+ regions 71, 171, 271, and 371. Preferably, a high dose arsenic implant and patterned photoresist masking layer are used to selectively incorporate the n type dopant into second layer 16. An arsenic implant dose in a range from $4.0 \times 10^{15}$ to $7.0 \times 10^{15}$ atoms/cm$^2$ and an implant energy of about 100 to 130 keV is suitable.

Following the high dose arsenic implant, first passivation layer 32 and second passivation layer 33 are formed over field passivation regions 21 and exposed active areas of second layer 16 as represented by step 1011. First passivation layer 32 preferably comprises a low temperature deposited silicon oxide about 1,500 to 3,000 angstroms thick. A standard low temperature oxide (LTO) process is suitable. Second passivation layer 33 preferably comprises an LPCVD silicon nitride about 900 to 1,500 angstroms thick.

In step 1012, n-type dopant from step 1010 is annealed to form n+ source regions 58, 158, and 258, n+ drain regions 61 and 161, and n+ regions 71, 171, 271, and 371. A 900° to 950° C., 30 to 50 minute furnace anneal in a non-reactive environment (e.g., $N_2$) is suitable. Alternatively, an equivalent rapid thermal anneal (RTA) process is used.

In step 1013, p-type dopant is selectively incorporated into second layer 16 to form p+ regions 42 and 102, p+ source regions 202, and p+ drain region 203. Preferably, boron ion implantation and a patterned photoresist layer is used. Preferably, the boron is implanted through second passivation layer 33 and first passivation layer 32. A boron implant dose in a range from about $5.0 \times 10^{15}$ to $1.0 \times 10^{16}$ atoms/$cm^2$ and an implant energy of about 110 to 160 keV is suitable. The incorporated boron is redistributed during subsequent processing to form p+ regions 42 and 102, p+ source regions 202, and p+ drain region 203.

In step 1014, ILDO layer 34 is deposited over second passivation layer 33. Preferably, ILDO layer 34 comprises boro-phospho-silicate-glass (BPSG), has a thickness in a range from 7,000 to 10,000 angstroms, and is deposited using conventional chemical vapor deposition (CVD) techniques. The boron and phosphorous concentrations in ILDO layer 34 are such that ILDO layer 34 subsequently flows at an elevated temperature. Following the deposition, ILDO layer 34 is exposed to a flow process comprising a temperature of about 900° to 950° C. and a time of about 15 to 30 minutes. Preferably during a first portion of the flow process, an $N_2$ ambient is used, and during a second portion, a dry $O_2$ ambient is used.

During step 1015, openings for shunt capacitor structure 24 and series capacitor structure 28 are formed to prepare for the formation of dielectric layer 37. Conventional photoresist and etching techniques are used to expose a portion of second layer 16 for shunt capacitor structure 24 and a portion of ohmic layer 366 for series capacitor structure 28.

Following step 1015, ILDO layer 34 is again exposed to a reflow process as represented by step 1016. This step is important to prevent stress cracks from occurring in dielectric layer 37 during its subsequent formation in step 1017. Preferably, ILDO layer 34 is exposed to about 900° C. for about 20 to 30 minutes in a low flow $O_2$ ambient.

In step 1017, dielectric layer 37 is formed to provide the capacitor dielectric for shunt capacitor structure 24 and series capacitor structure 28. Also, dielectric layer 37 provides additional separation for inductor structure 23 and transmission line structure 26 from ground plane layer 14. Preferably, dielectric layer 37 comprises an LPCVD silicon nitride with a thickness of about 1,000 to 1,200 angstroms.

In step 1018, residual layers are removed from the lower surface of ground plane layer 14 and contact openings are formed for ohmic layer 39. To remove any residual layers from the lower surface of ground plane layer 14, the upper surfaces of structure 10 is coated with a protective film (e.g., photoresist) and the residual films are removed using the appropriate etchants. After the residual films are removed, the protective film is removed.

Figure 15:
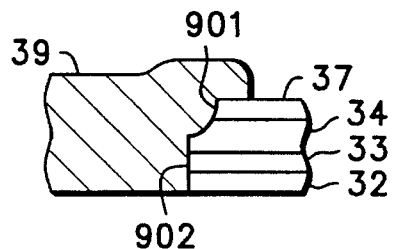
FIG. 15 illustrates an enlarged cross-sectional view of a portion of a structure according to the present invention.

Next, a conventional photoresist process is used to prepare structure 10 for an etch process to form openings for ohmic layer 39. Preferably, a two-step etch process is used comprising an isotropic or taper etch followed by an anisotropic or straight-wall etch. Preferably, the first 3,500 to 5,000 angstroms is taper etched to provide better ohmic layer step coverage as shown in FIG. 15. FIG. 15 is an enlarged cross-sectional view of portion of structure 10 showing a preferred taper etch portion 901 and a straight-wall portion 902 together with a portion of ohmic layer 39, dielectric layer 37, ILDO layer 34, second passivation layer 33, and first passivation layer 32.

Referring now back to FIG. 14, ohmic layer 39 is formed during step 1019. Preferably, ohmic layer 39 comprises aluminum or an aluminum alloy (e.g., AlCuSi) and has a thickness in excess of 1.0 micron to provide a low resistivity metallization. Alternatively, ohmic layer 39 comprises a 750 to 3,000 angstrom titanium-tungsten (TiW) barrier metal layer and at least a 1.0 micron aluminum alloy (e.g., AlCu) layer over the TiW layer. Preferably, conventional sputtering techniques are used to form ohmic layer 39. Following the formation of ohmic layer 39, it is patterned using conventional techniques to provide the contact leads to the device and component terminals of structure 10 as well as the top plates for series capacitor structure 28 and shunt capacitor structure 24 as shown in FIGS. 2, 3, 5, 7, 9, and 11–13.

In step 1020, ILD1 layer 43 is formed. To form ILD1 layer 43, a 2.0 micron silicon oxide layer is deposited over the upper surface of structure 10. A plasma-enhanced CVD (PECVD) silicon oxide is suitable. Following the deposition of the silicon oxide layer, a conventional thick photoresist (e.g., 2.0 microns)/etch back planarization process is used to planarize the 2.0 micron silicon oxide layer. Alternatively, a chemical mechanical process (CMP) is used to planarize the silicon oxide layer. Preferably, the planarization process leaves approximately 2,000 to 3,000 angstroms of silicon oxide. Following planarization, an additional 1.0 micron of PECVD silicon oxide is formed over the planarized silicon oxide to provide ILD1 layer 43.

In step 1021, contact openings or vias are etched in ILD1 layer 43 to allow ohmic layer 46 to make contact where appropriate. Preferably, as in step 1018, a taper etch is used followed by a straight-wall etch to provide the vias for ohmic layer 46. Preferably, the first 3,000 to 5,000 angstroms of ILD1 layer 43 is taper etched with the balance straight-wall etched. Conventional photolithography and etch techniques are used to form the vias.

During step 1022, ohmic layer 46 is deposited and patterned using conventional techniques. Preferably, ohmic layer 46 comprises an aluminum/copper/silicon alloy and has a thickness in excess of 1.5 microns. During steps 1023 and 1024, final passivation layer 44 is formed over structure 10 and patterned to provide the final vias for making appropriate contacts to the ohmic layers. Preferably, final passivation layer 44 comprises a phospho-silicate glass (PSG) and a PECVD silicon oxide/silicon nitride film combination formed on the PSG layer. Following the formation of final passivation layer 44, structure 10 preferably is exposed to a 400° to 500° C. forming gas anneal.

Although an n-channel LDMOS structure is used in the above description, the structures and methods according to the present invention support a p-channel LDMOS structure with the above n and p type regions switched.

By now it should be appreciated that there has been provided structures and methods for integrating passive components, ESD structures, and logic structures into a high frequency LDMOS transistor process flow to form a silicon-based monolithic high frequency integrated circuit. The structures and methods utilize the design of the LDMOS transistor thus minimizing additional process steps and greatly simplifying integration. The monolithic high frequency integrated structure provides good RF performance and is significantly smaller than prior art hybrid discrete component designs. In addition, the structure is more cost effective and easier to manufacture than equivalent III-V based designs.

We claim:

1. A monolithic high frequency integrated circuit structure comprising:

a semiconductor body including a substrate of a first conductivity type and a first layer of the first conductivity type formed on the substrate, the substrate having a higher dopant concentration than the first layer, wherein the first layer is isolated into a plurality of active areas by a plurality of passivation regions;

a high frequency power FET device formed in a first active area, the high frequency power FET device including a first source region of a second conductivity type, a first drain region of the second conductivity type spaced apart from the first source region, a first gate electrode layer between the first source region and the first drain region and separated from the first layer by a first gate dielectric layer, and a first sinker region of the first conductivity type formed in the first layer and connecting the first source region to the substrate; and a series capacitor structure including a bottom plate formed on one of the plurality of passivation regions, a dielectric layer formed on the bottom plate, and a top plate formed on the dielectric layer.

2. The structure of claim 1 further comprising a second passive component formed in a second active area.

3. The structure of claim 2 wherein the second passive component includes a shunt capacitor structure, the shunt capacitor comprising a second sinker region of the first conductivity type extending from an upper surface of the first layer to the substrate, a dielectric layer contacting the upper surface of the first layer above the second sinker region, and a top plate formed on the dielectric layer, wherein the second sinker region forms a bottom plate of the shunt capacitor structure.

4. The structure of claim 1 further comprising an inductor structure formed above one of the plurality of passivation regions.

5. The structure of claim 4 wherein the inductor structure comprises a multi-level metallization and has a spiral shape such that the inductor structure has a centrally located core.

6. The structure of claim 5 wherein the multi-level metallization includes a first metal layer and a second metal layer formed on the first metal layer, portions of the first metal layer terminating to provide a gap for connecting a center tap line to the centrally located core of the inductor structure, the second metal layer providing a bridge over the center tap line, wherein an interlayer dielectric layer separates the second metal layer from the center tap line.

7. The structure of claim 5 wherein the multi-level metallization includes a first metal layer and second metal layer formed on the first metal layer, portions of the second metal layer terminating to provide a gap for connecting a center tap line to the centrally located core of the inductor structure, the first metal layer providing a bridge under the center tap line, wherein a interlayer dielectric layer separates the first metal layer from the center tap line.

8. The structure of claim 1 wherein the bottom plate and the first gate electrode layer comprise a same material.

9. The structure of claim 1 further comprising a transmission line structure formed above one of the plurality of passivation regions, the transmission line structure comprising a multi-level metallization.

10. The structure of claim 1 further comprising a resistor structure, wherein the resistor structure and the first gate electrode layer comprise a same material.

11. The structure of claim 1 further comprising an ESD structure formed in a third active area.

12. The structure of claim 11 wherein the ESD structure comprises a shunt diode structure, the shunt diode structure including a first doped region of the second conductivity type formed in the third active area.

13. The structure of claim 12 further comprising a first high voltage region of the first conductivity type formed in the first layer, the first doped region within the first high voltage region.

14. The structure of claim 12 wherein the first doped region has a width of about 4 to 5 microns.

15. The structure of claim 11 wherein the first conductivity type is p-type and the second conductivity type is n-type, and wherein the ESD structure comprises an NMOS transistor structure and a shunt diode structure, the NMOS transistor in a shorted gate/source configuration, the NMOS transistor including a second source region of the second conductivity type, a third sinker region of the first conductivity type extending from an upper surface of the first layer to the substrate, a second drain region of the second conductivity type, a second gate electrode layer between the second source region and the second drain region and separated from the first layer by a second gate dielectric layer, the second source region of the NMOS transistor coupled to the third sinker region, and wherein the shunt diode structure comprises a first doped region of the second conductivity type formed in the first layer, and wherein the second drain region and the first doped region are a common region.

16. The structure of claim 15 further comprising a second high voltage region of the first conductivity type formed in the first layer, the first doped region within the second high voltage region.

17. The structure of claim 11 wherein first conductivity type is p-type and the second conductivity type is n-type, and wherein the ESD structure comprises an NMOS transistor structure and a shunt diode structure, the NMOS transistor structure in a shorted gate/drain configuration, and wherein the NMOS transistor structure includes a thick gate oxide such that the NMOS transistor structure has a threshold voltage in excess of about 7 volts.

18. The structure of claim 1 wherein the first gate electrode layer comprises a doped polycrystalline semiconductor layer and a metal layer formed on the doped polycrystalline semiconductor layer.

19. The structure of claim 1 further comprising a logic structure formed in a portion of the plurality of active areas.

20. The structure of claim 19 wherein the first conductivity type is p-type and the second conductivity type is n-type such that the high frequency power FET device is an n-channel device, and wherein the logic structure includes an NMOS portion formed in a fourth active area and a PMOS portion formed in a fifth active, and wherein the NMOS portion includes a third source region coupled to the substrate.

21. The structure of claim 20 wherein the logic structure further includes a ground contact portion formed in a sixth active area and coupled to the substrate, the third source region coupled to the ground contact portion.

22. The structure of claim 20 wherein the NMOS portion and the PMOS portion have a same pitch.

23. The structure of claim 20 wherein the NMOS portion comprises a ground/signal/ground configuration.

24. The structure of claim 20 wherein the PMOS portion comprises a $V_{DD}$/signal/$V_{DD}$ configuration.

25. A monolithic high frequency power amplifier integrated circuit structure comprising:

a ground plane layer of a first conductivity type;

an epitaxial layer of the first conductivity type formed on the ground plane layer, the epitaxial layer having a lower dopant concentration than the ground plane layer;

a plurality of passivation regions selectively formed on portions of the epitaxial layer to provide first and second active areas;

a silicon-based high frequency power FET device formed in the first active area, the silicon-based high frequency power FET device having a source connected to the ground plane layer;

a series capacitor structure formed on one of the plurality of passivation regions; and a logic structure formed in the second active area.

26. The structure of claim 25 wherein the plurality of passivation regions is selectively formed to further provide a third active area, and wherein the structure further includes a shunt capacitor structure formed in the third active area.

27. The structure of claim 25 further comprising an inductor structure formed on one of the plurality of passivation regions, the inductor structure comprising a first ohmic layer and a second ohmic layer formed on the first ohmic layer.

28. The structure of claim 25 further comprising a transmission line structure formed on one of the plurality of passivation regions, the transmission line structure comprising a first ohmic layer and a second ohmic layer formed on the first ohmic layer.

29. The structure of claim 25 further comprising a resistor structure formed on one of the plurality of passivation regions.

30. The structure of claim 25 wherein the plurality of passivation regions is selectively formed to further provide a fourth active area, and wherein the structure further comprises an ESD structure formed in the fourth active area.

31. The structure of claim 25 wherein the logic structure includes an NMOS portion and a PMOS portion, the NMOS portion including a source region coupled to the ground plane layer.

32. The structure of claims 31 wherein the plurality of passivation regions is selectively formed to further provide a fifth and sixth active areas, and wherein the NMOS portion is formed in second active area, and wherein the PMOS portion is formed in the fifth active area, and wherein the logic structure further includes a ground contact portion coupled to the ground plane layer and formed in the sixth active area, and wherein the source region of the NMOS portion is coupled to the ground plane layer through the ground contact portion.

* * * * *